(12) United States Patent

Garrn

US011162172B2

(10) Patent No.: US 11,162,172 B2
(45) Date of Patent: Nov. 2, 2021

(54) METHOD FOR COATING TEMPERATURE-SENSITIVE SUBSTRATES WITH POLYCRYSTALLINE DIAMOND

(71) Applicant: Guehring KG, Albstadt (DE)

(72) Inventor: Immo Garrn, Ertingen (DE)

(73) Assignee: Guehring KG, Albstadt (DE)

( * ) Notice: Subject to any disclaimer, the term of this patent is extended or adjusted under 35 U.S.C. 154(b) by 0 days.

(21) Appl. No.: 16/792,975

(22) Filed: Feb. 18, 2020

(65) Prior Publication Data

US 2020/0283891 A1 Sep. 10, 2020

Related U.S. Application Data

(63) Continuation of application No. PCT/EP2018/072193, filed on Aug. 16, 2018.

(30) Foreign Application Priority Data

Aug. 18, 2017 (DE) .................. 10 2017 214 432.7
Sep. 29, 2017 (DE) .................. 10 2017 217 464.1

(51) Int. Cl.
C23C 16/27 (2006.01)
C23C 16/515 (2006.01)
C23C 16/52 (2006.01)

(52) U.S. Cl.
CPC .......... C23C 16/271 (2013.01); C23C 16/279 (2013.01); C23C 16/515 (2013.01); C23C 16/52 (2013.01)

(58) Field of Classification Search
CPC ..... C23C 16/26; C23C 16/271; C23C 16/279; C23C 16/515; C23C 16/52
See application file for complete search history.

(56) References Cited

U.S. PATENT DOCUMENTS

| | | | | |
|---|---|---|---|---|
| 4,919,974 A * | 4/1990 | McCune | ................ | C22C 26/00 427/122 |
| 4,992,082 A * | 2/1991 | Drawl | ................ | C23C 14/06 51/295 |
| 5,133,849 A * | 7/1992 | Kinoshita | ........... | C23C 14/0021 118/723 VE |
| 5,146,481 A * | 9/1992 | Garg | ................ | C23C 16/271 378/35 |
| 5,240,736 A * | 8/1993 | Wu | ................ | C23C 16/52 118/666 |
| 5,547,716 A | 8/1996 | Thaler | | |
| 5,855,998 A * | 1/1999 | Tanabe | ............. | H01L 21/30625 428/216 |
| 6,161,499 A * | 12/2000 | Sun | ................ | C23C 16/02 118/723 E |
| 6,372,303 B1 | 4/2002 | Burger et al. | | |
| 6,632,127 B1 | 10/2003 | Zimmer et al. | | |
| 6,869,676 B2 | 3/2005 | Burger et al. | | |
| 7,662,441 B2 | 2/2010 | Gicquel et al. | | |
| 7,727,798 B1 * | 6/2010 | Wang | ................ | H01L 31/1804 438/105 |
| 7,942,111 B2 | 5/2011 | Burger et al. | | |
| 2001/0053422 A1 * | 12/2001 | Lee | ................ | H01J 37/32027 427/569 |
| 2002/0100420 A1 | 8/2002 | Burger et al. | | |
| 2005/0098119 A1 | 5/2005 | Burger et al. | | |
| 2006/0153994 A1 | 7/2006 | Gicquel et al. | | |
| 2006/0219158 A1 | 10/2006 | Breidt et al. | | |
| 2020/0102647 A1 * | 4/2020 | Dini | ................ | C23C 16/0272 |

FOREIGN PATENT DOCUMENTS

| | | |
|---|---|---|
| CA | 2 512 731 A | 7/2004 |
| CN | 106756880 A | 5/2017 |
| DE | 198 26 259 A1 | 12/1998 |
| JP | H0917325 A | 1/1997 |
| WO | 94/26425 A1 | 11/1994 |

OTHER PUBLICATIONS

Motahari, Hamid, et al., "A new tubular hot-wire CVD for diamond coating". Applied Physics A 123(6), 411, May 2017, pp. 1-7.*
Alcantar-Peña, J.J., et al., "Low temperature hot filament chemical vapor deposition of Ultrananocrystalline Diamond films with tunable sheet resistance for electronic power devices". Diamond & Related Materials 69 (2016) 207-213.*
Ali, Murbarak, et al., "Growth of in situ multilayer diamond films by varying substrate-filament distance in hot-filament chemical vapor deposition". J. Mater. Res., vol. 27, No. 24, Dec. 28, 2012, pp. 3123-3129.*
Schropp, R.E.I, "Industrialization of Hot Wire Chemical Vapor Deposition for thin film applications". Thin Solid Films 595 (2015) 272-283.*
Arnault, J.C., et al., "Effects of the bias enhanced nucleation hot-filament chemical-vapor deposition parameters on diamond nucleation on iridium". Journal of Applied Physics 98, 033521 (2005) pp. 1-9.*

(Continued)

Primary Examiner — Bret P Chen
(74) Attorney, Agent, or Firm — Burr & Brown, PLLC

(57) ABSTRACT

A method for coating temperature-sensitive substrates with polycrystalline diamond by a hot-wire CVD method, in which hydrogen and at least one carbon carrier gas are fed into a coating chamber. The fed gases are split at an electrically heated wire in such a way that carbon is formed and deposits on the temperature-sensitive substrate in the form of the diamond modification thereof. The substrate is arranged in the coating chamber, which is at a reduced pressure, and electrical power to electrically heat the wire is adjustable. The method is performed cyclically in respect of the electrical power that is fed to electrically heat the wire. A basic power is fed as lower threshold value for a predetermined time (basic load phase) and is increased for a further predetermined time to a maximum power as an upper threshold value (pulse phase) and is then reduced again to the basic power.

11 Claims, No Drawings

(56) References Cited

OTHER PUBLICATIONS

Lai, Guan-Ren, et al., "Deposition of Diamond Films in a Closed Hot Filament CVD System". Journal of Research of the National Institute of Standards and Technology, vol. 100, No. 1, Jan.-Feb. 1995, pp. 43-49.*

Chu, C.J., et al., "Mechanism of diamond film growth by hot-filament CVD: Carbon-13 studies." Journal of Materials Research 5, 2405-2413 (1990). Abstract Only.*

Nagasaka, Hiroshi, et al., "Tribological properties of polycrystalline diamond films prepared by hot-filament chemical vapor deposition methods". Proceedings of the 16th International Conference on Nanotechnology Sendai, Japan, Aug. 22-25, 2016, pp. 616-619.*

Gracio, J.J., et al., "Diamond growth by chemical vapour deposition". Journal of Physics D: Applied Physics 43, 37 (2010) 374017, pp. 1-75. DOI : 10.1088/0022-3727/43/37/374017.*

Matsumoto et al., "Vapor Deposition of Diamond Particles from Methane" (1982).

International Search Report and Written Opinion of the International Searching Authority from a corresponding international patent application dated Nov. 27, 2018, 19 pages.

International Preliminary Report on Patentability from a corresponding international patent application dated Feb. 18, 2020, 7 pages.

* cited by examiner

METHOD FOR COATING TEMPERATURE-SENSITIVE SUBSTRATES WITH POLYCRYSTALLINE DIAMOND

The present invention relates to a method for coating temperature-sensitive substrates with polycrystalline diamond by means of a hot-wire CVD method according to the preamble of claim 1.

CVD diamond deposition methods have already been available since 1982 [Matsumoto S, et al. (1982): "Vapor deposition of diamond particles from methane." Jpn J Appl Phys; 21 (4): L183-5].

An overview of today's state of the industrially used CVD diamond-coated tools and in particular chip-removing cutting tools and the use potential thereof as well as different CVD diamond-coating methods can be found in the dissertation by Fiona Sammler entitled "Increase of the use potentials of CVD diamond-coated tools" of the faculty V—Mechanical Engineering and Transport Systems at the Technical University Berlin of Apr. 17, 2015.

The chemical gas phase deposition makes it possible to directly deposit diamond coats to tool substrates, but also to those with complex geometries. In contrast to the widespread cutting material of polycrystalline diamond (PCD), which is soldered in the form of blanks onto a hard metal carrier, this provides, for example, for a geometric flexibility of the tools, which is higher as a whole.

The so-called hot-wire CVD method, in the case of which a vapor deposition method is performed by reaction of methane and hydrogen in a vacuum at a hot tungsten wire in order to deposit the carbon created in the high vacuum on the substrate surface in its cubic crystalline diamond modification, is a relatively simple option for applying a diamond coating to a functional area of a tool.

The tungsten wire is thereby typically supplied with a constant electrical power in order to keep the wire at a constant temperature of between 2000° C. and 3000° C. during the entire deposition of the diamond film.

Temperatures of >2000° C. have to in particular prevail at the heating wires in order to attain technically and economically expedient diamond deposition rates during the hot-wire CVD coating and in order to trigger the decomposition reaction of the reaction gases. Such constant temperatures of between 2000 and 3000° C., however, inevitably lead to a heating of the entire reaction chamber, so that operating temperatures of between 800° C. and 1000° C. are reached.

This temperature is too high for many substrates, in order to withstand the coating process without changing their application-relevant properties. Steel is soft-annealed, for example, and experiences structural changes or sintered polycrystalline diamond cutting inserts are graphitized, i.e. the cubic crystalline diamond converts into the hexagonal graphite again, whereby the desired hardness and the increased tribological resistance may suffer significantly or are even lost completely.

A plasma CVD method for coating a substrate with carbon, in particular amorphous carbon or silicon is further known from the prior art of DE 198 26 259 A1, in the case of which a substrate voltage, which is generated independently of the coating plasma and which is changed during the coating, is applied to the electroconductive substrate to control the ion bombardment during the coating, whereby the substrate voltage is a bipolar-pulsed direct current voltage with a frequency of between 0.1 kHz and 10 MHz.

DE 198 26 259 A1 has the object of specifying a highly scalable method, which can be used for industrial batch sizes as well as a device for carrying out said method, which makes it possible to coat substrates evenly and at high rates, and of specifying a wear-resistant and friction-reducing multilayer structure.

According to DE 198 26 259 A1, this object is solved in the case of the plasma CVD coating method by means of a separation of the substrate voltage generation from the voltage required for the plasma generation, which, according to the teaching of DE 198 26 259 A1 allows for a systematic exertion of influence on the physical properties of the generated layers. It is described in particular in DE 198 26 259 A1 that the separation of plasma generation and substrate voltage generation also allows for a regulation of the substrate temperature. According to DE 198 26 259 A1, coatings can frequently take place at temperatures of 200° C. and below.

According to DE 198 26 259 A1, a pulsed bipolar direct current voltage is used as substrate voltage, which can be changed with regard to size and duration of the negative impulse, size and duration of the positive impulse, as well as the voltage-free intermediate intervals or pause times, respectively. However, a disadvantage of the method of DE 198 26 259 A1 is the large technical effort with which the substrate temperature can be regulated by means of the separation of plasma generation and substrate voltage generation, and which cannot be used in the case of hot-wire CVD diamond coating methods, because the technical mode of operation is completely different.

CA 2 512 731 C furthermore describes a heating of the walls of a plasma CVD coating chamber, in the case of which hydrogen atoms from the plasma recombine and can thus no longer participate in the reaction. To solve this problem, a method for generating a plasma in the vicinity of a substrate to be coated is proposed, wherein the substrate is subjected to a gas, which includes at least hydrogen and carbon, wherein a pulsed microwave plasma with a peak power density of at least 100 $W/cm^3$ is used, wherein the is kept between 700° C. and 1000° C. and the pressure is kept between 100 mbar and 350 mbar. High diamond deposition rates and high qualities of the diamond films are attained with a method of this type.

Laser CVD coating methods are furthermore also described in the prior art. WO 9426425 A1, for example, discloses a pulsed laser method for coating a substrate of a gas mixture of hydrogen and a hydrocarbon.

It is thus the technical object of the present invention to provide a hot-wire CVD diamond coating method, in the case of which the substrate temperature is lowered so far that a sufficient crystallization of CVD diamond still occurs on the one hand and that the desired application properties of the substrate are not influenced in a relevant manner or are even destroyed on the other hand. Thirdly, the temperature of the hot wire has to be so high that radicals are available to a sufficient extent for the layer synthesis.

This object is solved by means of the characterizing features of patent claim 1.

The object is solved in particular in that, based on a basis, which, on its own, would heat the coating chamber to a temperature, which lies in the lower range of the temperature that is necessary for the crystallization and layer connection, which is called "base temperature", the power introduction and the heating wires is increased pulse by pulse only so far that radicals are created to a sufficient extent so as to reach a coating boost. This power pulse is maximally guided until the substrate temperature, which is maximally permissible for the crystallization and layer connection, is reached. This boost is followed by a phase, in which only the basic power is fed and the substrate temperature drops to the base temperature again. The cycle then begins again and ends after the total duration $t_{Gas}$ of the coating method.

The present invention in particular relates to a method for coating temperature-sensitive substrates with polycrystalline diamond by means of a hot-wire CVD method, wherein hydrogen and at least one carbon carrier gas are fed into a coating chamber, wherein the fed gases are split at an electrically heated wire in such a way that carbon radicals are formed, which are deposited on the temperature-sensitive substrate in the form of the diamond modification thereof, wherein the substrate is arranged in the coating chamber, which is at reduced pressure, and wherein an electrical power required to electrically heat the wire is adjustable, wherein the method is performed cyclically with respect to the electrical power that is fed in order to electrically heat the wire, wherein a basic power $P_{Bas}$ is fed as lower threshold value for a predetermined time $t_1$ (basic load phase) and is increased for a further predetermined time $t_2$ to a maximum power $P_{max}$ as upper threshold value (pulse phase) and is then reduced again to the basic power $P_{Bas}$; and wherein the method is performed for a total duration of $t_{Ges}$.

Even though pulsed methods are generally known from the plasma CVD and laser CVD diamond coating methods, these principles cannot be transferred to the hot-wire CVD diamond coating method, because completely different physical ambient conditions are at hand here. All methods other than the hot-wire CVD diamond coating methods in particular have in common that one virtually encounters an ON/OFF situation, when the ion source is turned off, i.e. only "post-flying times" of the ions have to still be considered, which have already been accelerated in the direction of the substrate surface. These "post-flying times" lie within the nanosecond to microsecond range. In contrast to the present invention in the case of the hot-wire CVD method, it was surprising that the supply of the hot wire with pulsed heating power does in fact lead to expedient diamond deposition rates while simultaneously reducing the temperature of the substrate.

The person of skill in the art could further not foresee that, as part of the present invention, it is possible without interfering with the coating to produce a substrate temperature by means of pulsed heating of the hot filament such that the latter is not changed in its crystallographic and structural properties. In response to the coating of cutting inserts of polycrystalline diamond (PCD), which is sintered of nanocrystalline CVD diamonds with a grain size distribution of between 0.1 and 50 µm, the substrate temperature of 650° C. must not be exceeded, for example, because a graphitization of the PCD, combined with a significant loss of strength, occurs otherwise. To reach this temperature, the power fed into the heating wire assembly of a commercial coating plant must not exceed 14 kW. This corresponds to a filament temperature of approx. 2000° C. Under these conditions, diamond deposition rates of <30 nm/h result, which are not economic deposition rates, because the coating would take too long.

The subclaims represent preferred embodiments of the present invention.

A preferred embodiment of the present invention is in particular that, depending on the substrate, the basic power $P_{Bas}$ during the basic load phase is approx. 50-75% of the power in the pulse phase.

In the practical performance of the present method, a duration $t_1$ of the basic load phase of between 1 µs and 120 s has turned out to be advantageous.

The duration $t_2$ of the pulse phase preferably lies between 1 µs and 60 s, which leads to even coatings at expedient diamond deposition rates during continuous operation.

The total duration $t_{Ges}$ of the method lies in the range of between 5 and 100 h, in particular between 50 and 60 h.

During the pulse phase, the temperature of the hot wire can be between 2000° C. and 3000° C., whereby a tungsten wire is typically preferred.

An advantageous embodiment of the present invention is that the temperature of the substrate to be coated, depending on the latter, lies between 500° C. and 600° C. in the basic load phase and between 600° C. and 650° C. in the pulse phase.

In the pulse phase, diamond deposition rates of between 100 nm/h and 200 nm/h, in particular approx. 150 nm/h, are attained by means of the present method.

This is sufficient to economically create diamond films on complex geometries of a chip-removing tool.

Further advantages and features of the present invention follow on the basis of the description of an exemplary embodiment.

EXAMPLE

For an exemplary diamond coating by means of the hot-wire CVD method, a PCD cutting insert is introduced into the reaction chamber of a commercially available coating plant, e.g. of a CemeCon CC800/5 Dia plant, in the present example. The PCD cutting insert is a sintered body of diamonds with a grain size distribution of between 0.1 and 50 µm. A solid PCD of this type must not exceed a substrate temperature of 650° C., because a reconversion of the cubic crystalline diamond into a hexagonal crystalline structure of the carbon takes place otherwise, which is generally referred to as "graphitization". Such graphitizations of the PCD are inevitably associated with a loss of strength and also with the destruction of the structure of the PCD.

To coat a solid PCD cutting insert of this type, the heating wire assembly of the used HD-CVD coating plant must not exceed a fed power of 14 kW. According to the invention, the power introduction with a basic power of approx. 13.5 kW is increased to 20 kW for a time period of between 0.5 s and 5 s in a sequence of pulse phases, so that the filament temperature of the used tungsten wire increases to 2500° C. for this short period of time. In the constantly conducted continuous operation, this would lead to a diamond deposition rate of approx. 300 nm/h, but whereby the substrate temperature of 900° C. would also be reached, but which would then lead to the above-described graphitization effects and lattice conversions.

According to the invention, the introduction of the electrical power is shortened to the above-mentioned time window $t_2$, and the substrate temperature thus does not rise above 650° C., wherein the deposition rate is still approx. 150 nm/h. Diamond films can be deposited economically—in the case in point within approx. 60 h—on temperature-sensitive substrates with this diamond deposition rate.

In the case of the practical performance of the method according to the invention, basic powers $P_{Bas}$ of between 10 and 15 KW can appear during the basic load phase depending on the substrate, and the maximal power $P_{max}$ can be between 18 and 30 KW during the pulse phase depending on the substrate.

Functional areas of chip-removing tools or cutting inserts, which were diamond-coated by means of the method according to the invention, display large strengths and long service lives and are thus optimally suited for the industrial production of chip-removing tools with diamond coating.

The invention claimed is:

1. A hot-wire CVD method for coating a substrate with polycrystalline diamond, wherein hydrogen and at least one carbon carrier gas are fed into a coating chamber, wherein the fed gases are split at an electrically heated wire in such a way that carbon is formed, which is deposited on the substrate in the form of diamond, wherein the substrate is arranged in the coating chamber, which is at reduced pressure; and wherein an electrical power required to electrically heat the wire is adjustable, wherein the method is performed cyclically with respect to the electrical power that is fed in order to electrically heat the wire, wherein a basic power $P_{Bas}$ is fed as lower threshold value for a predetermined time $t_1$ in a basic load phase, and is increased for a further predetermined time $t_2$ to a maximum power $P_{max}$ as upper threshold value in a pulse phase, and is then reduced again to the basic power $P_{Bas}$.

2. The method according to claim 1, wherein the basic power $P_{Bas}$ during the basic load phase is 50-75% of the power in the pulse phase.

3. The method according to claim 1, wherein the duration $t_1$ of a basic load phase lies between 1 μs and 120 s.

4. The method according to claim 1, wherein the duration $t_2$ of a pulse phase lies between 1 μs and 60 s.

5. The method according to claim 1, wherein the method is performed in a total duration tees between 5 and 100 h.

6. The method according to claim 1, wherein in the pulse phase, the temperature of the wire lies between 2000° C. and 3000° C.

7. The method according to claim 1, wherein the temperature of the substrate to be coated lies between 500° C. and 600° C. in the basic load phase and between 600° C. and 650° C. in the pulse phase.

8. The method according to claim 1, wherein in the pulse phase, the diamond deposition rate lies between 100 nm/h and 200 nm/h.

9. The method according to claim 1, wherein the basic power $P_{Bas}$ is 1-15 KW during the basic load phase, and the maximal power Pmax is between 18 and 30 KW during the pulse phase.

10. The method according to claim 1, wherein the method is performed for a total duration $t_{Ges}$ between 50 and 60 h.

11. The method according to claim 1, wherein in the pulse phase, the diamond deposition rate is approximately 150 nm/h.

* * * * *